United States Patent [19]

Rideout et al.

[11] 3,881,113

[45] Apr. 29, 1975

[54] INTEGRATED OPTICALLY COUPLED LIGHT EMITTER AND SENSOR

[75] Inventors: Vincent Leo Rideout, Mohegan Lake, N.Y.; Jerry Macpherson Woodall, Saratoga, Calif.

[73] Assignee: International Business Machines Corporation, Armonk, N.Y.

[22] Filed: Dec. 26, 1973

[21] Appl. No.: 428,471

[52] U.S. Cl. .............. 250/551; 250/211 J; 250/552; 357/30

[51] Int. Cl. ....... G02f 1/28; H01l/11/00, H01l 15/00

[58] Field of Search ................. 250/551, 211 J, 552; 317/235 N; 357/30

[56] References Cited

UNITED STATES PATENTS

| | | | |
|---|---|---|---|
| 3,229,104 | 1/1966 | Rutz | 250/551 |
| 3,675,026 | 7/1972 | Woodall | 317/235 N |
| 3,677,836 | 7/1972 | Lorenz | 317/235 N |

*Primary Examiner*—James W. Lawrence
*Assistant Examiner*—T. N. Grigsby
*Attorney, Agent, or Firm*—Thomas J. Kilgannon, Jr.

[57] ABSTRACT

An optically coupled light emitting diode and photo detector is disclosed, which includes an isolation region made from the same semiconductor material as the light emitting diode and photo detector. The structure involved consists basically of four semiconductor regions, one pair of which is separated from another pair by a semiconductor isolation region. The isolation region is of the same semiconductor material as the pairs of semiconductor regions which form a light emitting diode and a photo detector. By using an isolation region of the same semiconductor material as that of the light emitting diode and the photo diode, an integrated device is provided which eliminates index of refraction and lattice constant mismatches between the light emitter and optical detector. The integrated device is fabricated from a single semiconductor material gallium aluminum arsenide and is fabricated using well known liquid phase or other epitaxial growth techniques. The resulting structure is completely symmetrical and has the unusual feature that it can be operated bidirectionally, i.e., the light emitting and photo detecting functions are completely interchangeable.

10 Claims, 4 Drawing Figures

INTEGRATED OPTICALLY COUPLED LIGHT EMITTER AND SENSOR

BACKGROUND OF THE INVENTION

1. Field of the Invention

This invention relates generally to integrated, optically coupled light emitter-light sensor devices which are isolated, one from the other, by a layer of semiconductor material. More specifically, it relates to an integrated, optically coupled light emitting diode-photo diode arrangement in which the devices are separated, or isolated one from the other, by a semiconductor material which is the same semiconductor as that used to fabricate the light emitting diode and the photo diode. Still more specifically, it relates to an integrated, optically coupled light emitting diode-photo diode structure in which both of the devices are formed from gallium aluminum arsenide and in which both devices are electrically isolated, one from the other, and optically coupled to each other by a region of gallium aluminum arsenide. The structure, which may be fabricated by well known epitaxial deposition techniques, minimizes the losses of prior art devices which are principally due to low external quantum efficiency of prior art light emitting diodes and the low light collection efficiency of prior art photo diodes. The improvement in external efficiency in the light emitting diode of the present application is due to the fact that differences in indices of refraction between the semiconductor of the light emitting diode and the isolation medium are practically nil. For the same reason, the collection efficiency of the photo diode of the present application is similarly enhanced. In addition, the use of the same semiconductor material for LED, isolation medium and PD eliminates lattice constant mismatches between them which introduce high internal stresses that reduce the light emitting and collecting efficiency.

2. Description of the Prior Art

In general, and until fairly recently, optical isolators have been fabricated by glueing discrete light emitting diodes and photo detectors to either side of a glass substrate which served both as an electrical isolation region and as an optically transparent medium for transmitting light from the light emitting diode to the photo detector. More often than not, these arrangements, which are commercially available, required the use of photo transistors for the photo detector in order to compensate for large optical transmission losses between the light emitting diode and the photo detector unit. More recently, however, monolithic coupling devices, including a light emitter and light sensor, have appeared in the prior art and consist of light emitting diodes and photo detectors which are separated one from the other by a layer of some insulating semiconductor material which may be the same as the semiconductor material of the light emitting diode, but which is always different from the semiconductor material from which a photo detector is fabricated. Thus, while the prior art suggests that a light emitting diode-photo detector device may be fabricated from the same material, the prior art always shows the materials of the light emitting diode and the photo detector to be different when semi-insulating semiconductor material is used as the electrically isolating-optically coupling medium. Under such circumstances, while the lattice constants may be fairly close and the indices of refraction may also be fairly close, mismatches resulting from the differences in these parameters still exist, reducing the overall efficiency of the integrated optically coupled light emitting diode-photo detector structure.

U.S. Pat. No. 3,748,480 in the name of M. G. Coleman and issued July 24, 1973 is representative of the prior art wherein, if a semi-insulating material is utilized, the semiconductor material of the light emitting diode and the photo detector are different. In the patent, in one instance where semi-insulating material is used, gallium arsenide is used to form the light emitting diode whereas germanium is utilized for the photo detector. In other embodiments which incorporate a semi-insulating isolation region, gallium arsenide is used for the light emitting diode and lead sulfide for the photo detector. Where gallium arsenide and gallium phosphide are used for the light emitting diodes, silicon is suggested to form the photo detector. As previously indicated, the differences in the index of refraction and/or lattice constant of the materials utilized lead to mismatches in the device which reduce its efficiency and, in addition, require a rather more complex fabrication procedure.

In the present application, all of the mismatches and fabrication difficulties are overcome by the utilization of a single semiconductor material, gallium aluminum arsenide, resulting in a structure which is highly efficient and simple to fabricate. In addition, a completely symmetrical structure results in which the light emitting diode (LED) and photo detector (PD) functions are completely interchangeable.

SUMMARY OF THE INVENTION

The present invention generally relates to integrated optically coupled isolators consisting of a light emitting diode-photo detector arrangement in which the two devices are electrically isolated one from the other and optically coupled to each other via a high resistivity or semi-insulating region of semiconductor material. In accordance with the broadest aspect of the present invention, a bidirectional, integrated, optically coupled isolator is disclosed which comprises a light emitting diode, a photo detector and and isolation region interposed between the light emitting diode and the photo detector. The diode, photo detector and isolation region are all formed of a given semiconductor material. The isolation region is highly transparent to the light emitted by the diode due to the requirement that the energy gap of the isolation region is at lest 0.1 eV larger than the band gap of the light emitting region.

In accordance with more particular aspects of the present invention, the given semiconductor material is gallium aluminum arsenide.

In accordance with broader aspects of the present invention, a bidirectional, integrated, optically coupled isolator is provided, comprising a first light emitting-light responsive, two layer device of a given semiconductor material. A second light emitting-light responsive, two layer device of the same given semiconductor material is also provided. In addition, an isolation region of the same given semiconductor material is interposed between the first and second devices to electrically isolate the two devices and optically couple light emitted from one of the devices to the other of the devices; the latter acting as a photo detector.

In accordance with more particular aspects of the present invention, the light emitting diode comprises first and second layers of opposite conductivity type which form at their interface a light emitting p-n junction. The photo detector also comprises first and second layers of opposite conductivity types which form at their interface a light absorbing p-n junction.

In accordance with still more particular aspects of the present invention, the isolation region is a region of semi-insulating or intrinsic semiconductor material whose band gap is at least 0.1 eV greater than the band gap of the light emitting layer of the light emitting diode.

In accordance with still more particular aspects of the present invention, first and second contact regions of the same given semiconductor material are interposed between the light emitting diode and the isolation region and between the isolation region and the photo detector.

Each of the layers making up the integrated device is made of gallium aluminum arsenide and forms a completely symmetrical device in which the first layer of the light emitting diode and the photo detector are identical; the second layer of the light emitting diode and the photo detector are identical; and the first and second contact regions are identical. By properly adjusting the composition $x$, of the gallium aluminum arsenide, ($Ga_{1-x}Al_xAs$), the desired energy band gaps can be obtained. As $x$ varies from 0 to 1 the lattice constant variation and the index of refraction variation are very small. Thus, in addition to achieving an arrangement which can be bidirectionally operated, an integrated, optically coupled isolator of the same semiconductor material which substantially eliminates mismatches between various layers of the integrated device is provided.

It is, therefore, an object of the present invention to provide a bidirectional, integrated, optically coupled isolator all portions of which are fabricated from the same semiconductor material.

Another object is to reduce the index of refraction and lattice constant mismatches between the light emitter, optical isolation medium, and optical detector.

Still another object is to provide a device which is fabricated in an integral, multistep crystal growth epitaxial process.

Still another object is to provide an isolation medium which is highly transparent to the light emitted by the light emitting diode.

The foregoing and other objects, features and advantages of the present invention will be apparent from the following more particular description of a preferred embodiment as illustrated in the accompanying drawings.

DESCRIPTION OF THE PREFERRED EMBODIMENT

Figure 1A:
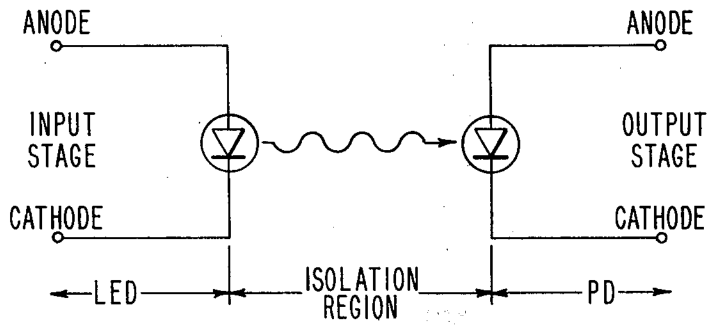
FIG. 1A is a schematic diagram of a light emitting diode optically coupled via an isolation region to a photo detector.

FIG. 1A shows schematically a light emitting diode, hereinafter called LED and indicated as such in FIG. 1A, optically coupled via an isolation region to a photo detector, hereinafter called PD and so indicated in FIG. 1A. In known arrangements, the isolation region may be air, glass, or semi-insulating semiconductor material which is at least partially transparent to the light emitted from the LED. Normally, the LED and PD are connected together in rather close proximity, the LED forming an input stage from which light is emitted into the PD which acts as an output stage. The LED of FIG. 1A may thus provide output data in the form of light to a PD which acts as a sensor whose output in the form of an electrical potential is connected to a computer or other data processing device. In some applications, the PD may be a photo diode or a photo transistor. Where mismatches due to the use of different semiconductor materials or materials having different indices of refraction or different lattice constants are present, photo transistors are normally required in order to amplify the relatively weak light received by the PD. Heretofore, the problem of increasing the efficiency of optically coupled isolators has been dealt with using semi-insulating isolation regions or by coupling the LED and the PD directly and electrically isolating by utilizing backward biased p-n junctions. In the latter instance, the same semiconductor material has been utilized but, in all instances where semiconductor isolating regions have been utilized, the LED and PD have been fabricated from different semiconductor materials.

Figure 1B:
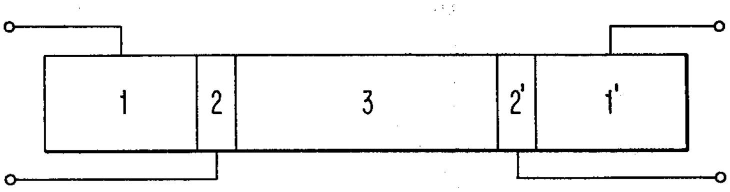
FIG. 1B is a schematic diagram of an idealized bidirectional, integrated, optically coupled isolator in which the two layers of the light emitting diode (LED) and the two layers of the photo detector (PD) are identical and, together with the isolation region, are all formed from the same semiconductor material.

FIG. 1B schematically shows an idealized version of a bidirectional, integrated, optically coupled isolator which is fabricated, in accordance with the teaaching of the present invention, of the same semiconductor material. This includes the LED, the PD, and the isolation region. In FIG. 1B, layers 1, 2 are of opposite conductivity type gallium aluminum arsenide forming a p-n junction therebetween from which light is emitted when the appropriate potentials are applied to leads 5 and 6 which are coupled to layers 1, 2, respectively. Light emitted from the p-n junction between layers 1 and 2 passes through isolation region 3 which has a relatively larger band gap. Isolation region 3 is fabricated from gallium aluminum arsenide which is semi-insulating in character by doping the gallium aluminum arsenide with carbon, chromium or oxygen. Alternatively, region 3 may be doped with an appropriate dopant such as sulphur or selenium to render it lightly doped n-conductivity type or of high resistivity. Because isolation region 3 is highly transparent to the output from the LED, light impinges upon a photo diode consisting of two layers 1', 2' which are identical in every respect to layers 1, 2 of the LED. When the light is absorbed in the PD formed by layers 1', 2' in a well known manner, an output voltage signal is developed across leads 7, 8 which are connected to regions 1', 2', respectively.

Figure 2:
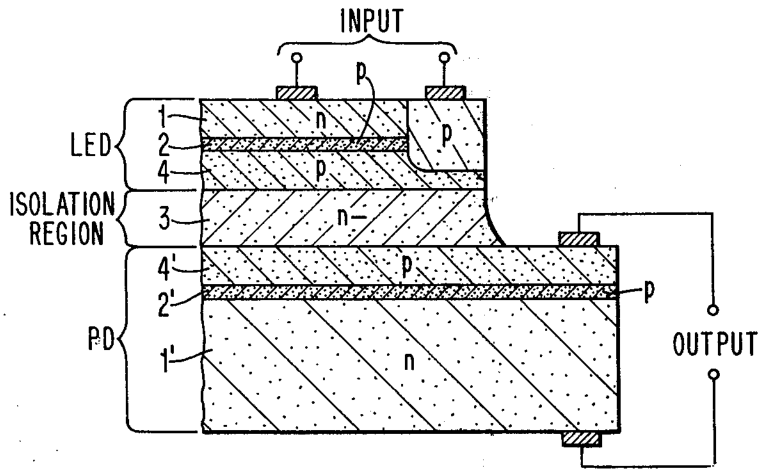
FIG. 2 is a cross-sectional view of a practical embodiment of the idealized arrangement shown in FIG. 1A which, in addition to the LED, PD and isolation region, includes contact regions which are also fabricated from the same semiconductor material.

FIG. 2 shows a cross-sectional view of a quarter section of what may be a circular, optically coupled isolator in accordance with the teaching of the present invention. The same reference characters have been used in FIGS. 1 and 2 where they identify the same elements. In FIG. 2 the LED is formed from layers 1, 2 of $Ga_{0.7}Al_{0.3}As$ and $Ga_{0.9}Al_{0.1}As$, respectively, which are of n- and p-conductivity type, respectively. A p-n junction 9 is formed at the interface of layer 1, 2. The LED of FIG. 2 contains an additional layer 4 of $Ga_{0.7}Al_{0.3}As$ of p-type conductivity which acts as a contact region for layer 2 which is the cathode of the LED device. Layer 4 facilitates ohmic contact to layer 2 which is very thin.

A PD formed from layers 1', 2', which are identical in every respect with layers 1, 2, forms a p-n junction 9' therebetween. In addition to layers 1', 2', layer 4' which is identical in every respect with layer 4 of the LED acts as a contact for layer 2' which is the cathode of the PD. Layer 4' facilitates ohmic contact to layer 2' which is very thin.

Isolation region 3 which is shown as a region of lighly doped n-conductivity type $Ga_{0.4}Al_{0.6}As$ is disposed between layers 4 and 4' and, as indicated hereinabove, acts to transmit light from light emitting p-n junction 9 to the PD. A diffused region 10 which penetrates layers 1, 2 is formed during the fabrication of the device of FIG. 2 and acts as a contact via layer 4 to layer 2. While not shown in FIG. 2, a substrate of gallium arsenide or other suitable material may be utilized as a support for the device of FIG. 2, but this is a matter of fabrication and handling convenience since the substrate layer performs no function as far as the operation of the device of FIG. 2 is concerned.

In operation, when an appropriate potential is applied to leads 5, 6, light is emitted from p-n junction 9 and transmitted through layer 4, isolation region 3, and layer 4', to layer 2' where, in accordance with the well known principles of photo detector operation, an output potential is obtained at the output via leads 7, 8 in response to the light impingement on the PD portion of the device in FIG. 2.

Figure 3:
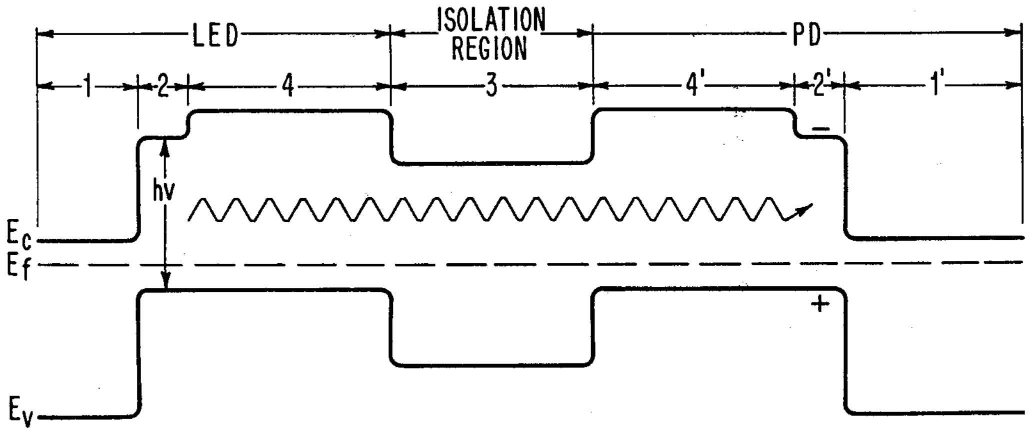
FIG. 3 is a graphical representation of the band structure of the bidirectional, integrated, optically coupled isolator of FIG. 2.

Referring now to FIG. 3, there is shown therein a graphical representation of the band structure of the bidirectional, integrated, optically coupled isolator of FIG. 2. In FIG. 3 the energy band structure is shown for each layer of the device of FIG. 2 and each portion of the band structure diagram has the same number as the corresponding layer of FIG. 2. It should be noted that the band structures for layers 1, 2 and 4 are identical with the band structure representations of layers 1', 2', and 4', respectively. This clearly indicates the symmetrical character of the arrangement of FIG. 2 and indicates that the structure of FIG. 2 has bidirectional operating characteristics.

Since the band structure of FIG. 3 is a function of the composition, $x$, of each layer, the band gaps of the various layers must be arranged so that light emitted from the p-n junction of two layers when functioning as a light emitting diode is transmitted through the cathode of the LED; the contact region for the cathode of the LED, and the isolation region with little or no attenuation. Also, the band gap of the PD portion of the device should be such that it readily absorbs light transmitted to it from the light emitting portion of the structure of FIG. 2. The various parameters involved in providing the structure of FIG. 2 are shown in the following Table I. Note that the band gap of the transmission medium 3 of the contact regions 4 and 4' must be greater by at least 0.1 eV than the band gap of the light emitting layer 2 so that the light is transmitted through the isolation medium and contacts regions with little or no attenuation.

TABLE I

| Device | LED | LED | LED | ISOLATION REGION | PD | PD | PD |
|---|---|---|---|---|---|---|---|
| Layer or Region | 1 | 2 | 4 | 3 | 4' | 2' | 1' |
| Width | 4 μ | 1–2 μ | 20 μ | 20–100 μ | 20 μ | 1–2 μ | 4 μ |
| Function | Anode of LED | Cathode of LED | Contact for LED | Isolation Region | Contact for PD | Cathode of PD | Anode of PD |
| Composition | $Ga_{1-x}Al_xAs$ | $Ga_{1-x}Al_xAs$ | $Ga_{1-x}Al_xAs$ | $Ga_{1-x}Al_xAs$ | $Ga_{1-x}Al_xAs$ | $Ga_{1-x}Al_xAs$ | $Ga_{1-x}Al_xAs$ |
| × | 0.3 | 0.1 | 0.3 | 0.6 | 0.3 | 0.1 | 0.3 |
| Doping ($cm^{-3}$) | $n=10^{17}-10^{18}$ | $p=10^{17}-5\times10^{17}$ | $p=10^{18}-10^{19}$ | semi-insulating (C,CR,O), $\cong 10^{6}$ or semiconductor $n- \cong 10^{14}$ | $p=10^{18}-10^{19}$ | $p=10^{17}-5\times10^{17}$ | $n=10^{17}-10^{18}$ |
| $E_g$ (eV) | 1.79 | 1.55 | 1.79 | 2.05 | 1.79 | 1.55 | 1.79 |
| Band gap Requirement | $E_{g1} \geq E_{g2}$ | $E_{g2}$ | $E_{g1} \geq E_{g2}+0.1$ | $E_{g3} \geq E_{g4}$ | $E_{g4}' \geq E_{g2}+0.1$ | $E_{g2}'$ | $E_{g1}' \geq E_{g2}'$ |

From the above table it should be clear that the device of FIG. 2 is symmetrical as far as the characteristics of the various layers are concerned. Thus, layer 1 is identical with layer 1', layer 2 is identical with laye 2', and layer 4 is identical with layer 4'. All layers are composed of gallium aluminum arsenide with their composition being varied from layer to layer as indicated by the variation in the value of $x$. It should be noted that isolation region 3 may be semi-insulating or lightly doped n-conductivity type to provide a semi-insulating or high resistivity region which isolates regions 4 and 4' electrically from each other. Based on the symmetry of the arrangement of FIG. 2, it should be clear that what is characterized in FIGS. 1A and 2 as an LED may also be a PD and vice versa.

The structure of FIG. 2 may be fabricated using well known prior art techniques. One fabrication approach which may be utilized is described in detail in a copending application entitled, "Isothermal Solution Mixing Growth of Solids" in the names of Grandia et al., Ser. No. 360,518, filed May 15, 1973, and assigned to the same assignee as the present invention. The application shows the growth of gallium aluminum arsenide layers of different composition on a gallium arsenide substrate. While the formation of only two layers on a substrate is shown in the above identified application, it should be clear that a plurality of melts of gallium arsenide of different composition can be utilized to provide the four different compositions required by the present application. In an arrangement similar to that shown in the above identified co-pending application, a partitioned, annular crucible having four chambers can be utilized to provide the required layered structure. Also, because of the symmetry of the structure of the present application, the fabrication process and apparatus are relatively more simplified that in situations where all of the layers would have a different composition or be formed of different semiconductor materials.

In the above identified copending application, a partitioned crucible is utilized which can contain, illustratively, two melts $M_A$ and $M_B$, respectively. The partitioned crucible is annular in shape and a cylindrical substrate holder made of high purity and high density pyrolytic graphite is receivable in the central aperture of the annular crucible. A substrate mounted in the graphite holder is brought into contact with each of the melts in apertures in the inner wall of the annular crucible by rotation of the holder such that the substrate is aligned with one of the apertures or windows on the inner wall of the crucible. This apparatus may be used in either the normal liquid phase epitaxial growth mode or the isothermal solution mixing growth mode, or both. For the isothermal mode of growth, a predetermined amount of one melt is trapped in the holder as it is rotated into the other melt. This trapped melt becomes supersaturated as it mixes with the other melt, causing crystal growth.

To form the structure of FIG. 2, a gallium arsenide substrate is mounted on the graphite substrate holder and introduced into the central aperture of the partitioned annular crucible so that it faces the inner wall of the annular crucible. The various melts, having the desired compositions as shown in Table I hereinabove, are introduced into the partitioned crucible. In the present example, the crucible requires four partitioned chambers to hold the melts of different gallium aluminum arsenide compositions required for the structure of FIG. 2. Once the desired melts have been introduced into the partitioned crucible, the epitaxial growth apparatus is evacuated, baked at low temperature, and then backfilled with hydrogen. The system is then heated to an appropriate temperature and for an appropriate soak time to permit the various melts to equilibrate. At this point, the substrate holder is rotated into one of the apertures or windows to connect the gallium arsenide substrate with the gallium aluminum arsenide melt within a partitioned portion of the crucible. Melt flows into the substrate chamber and growth is initiated by cooling the furnace at an appropriate rate as indicated in detail in the above identified copending application. When a desired first growth has been achieved, cooling may be continued after rotating the crucible holder into the next succeeding window, or cooling may be ceased and isothermal growth be continued by sequential rotations from the original window to succeeding windows. After the desired growth is achieved, the substrate holder is rotated so that it does not face a melt and the whole system is cooled to room temperature.

As indicated hereinabove, the method of the copending application is only one of a number of processes which may be utilized to form the layers of gallium aluminum arsenide which make up the various regions of the device of FIG. 2. Since the structure of FIG. 2 may be fabricated by any number of prior art techniques, it is believed that the process of the above identified copending application has been described herein in sufficient detail to permit one skilled in the art to duplicate the fabricating process utilized. In any event, a detailed discussion and fabrication process may be obtained by referring to the above identified copending application which is hereby incorporated by reference for that purpose.

After growing the layered structure of FIG. 2 having the desired parameters as indicated in Table I above, diffused region 10 of FIG. 2 may be formed by diffusing zinc into the LED such that diffusion 10 penetrates through layers 1 and 2 into contact region 4. The diffusion of region 10 may be carried out in a manner well known to those skilled in the art by masking the LED surface and diffusing zinc in a diffusion furnace for a time and temperature sufficient to reach the desired diffusion depth.

To apply a contact to layer 4, the device of FIG. 2, after diffusion of region 3, may be masked and etched in a well known manner to remove portions of layers 1, 2, 3, 4 to expose a surface portion of layer 4' to which lead 8 is ultimately attached. A 1% bromine in methanol solution may be utilized to etch the various layers with care being exercised to see that layer 4' is not significantly attacked.

While not specifically shown in FIG. 2, it should be appreciated that a heavily doped n-conductivity type substrate of gallium arsenide may be utilized as a support or substrate on which the layers of FIG. 2 are formed and supported. In such an instance, connection 7 would be made to the gallium arsenide substrate with the latter acting as a contact region to layer 1'. Connections 5, 6 and 7, 8 may be mated to their associated layers using well known contact materials. For example, Au-Ge may be used to contact n-conductivity type GaAlAs, while Au-Zu may be used to contact p-conductivity type GaAlAs. Also, the device of FIG. 2 does not have to be bidirectional. Thus, $x$ of regions 1, 2, and 4 could be different from $x$ of regions 1', 2', and 4', respectively.

Finally, while not specifically shown in FIG. 2, it should be appreciated that in addition to being functionally symmetrical, the device of FIG. 2 can be structurally symmetrical.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A bidirectional, integrated, optically coupled isolator comprising:

a light emitting diode of gallium aluminum arsenide semiconductor material, a photo detector of gallium aluminum arsenide semiconductor material, an isolation region of gallium aluminum arsenide semiconductor material interposed between said diode and said photo detector said isolation region being highly transparent to light emitted by said diode and wherein said isolation region is $Ga_{0.4}Al_{0.6}As$, wherein said isolation region is semi-insulating and has a doping level of $10^6$ atoms/cm$^3$ and a band gap, $E_g$, of 2.05 eV.

2. A bidirectional, integrated, optically coupled isolator comprising:

a light emitting diode of gallium aluminum arsenide semiconductor material, a photo detector of gallium aluminum arsenide semiconductor material, an isolation region of gallium aluminum arsenide semiconductor material interposed between said diode and said photo detector said isolation region being highly transparent to light emitted by said diode and wherein said isolation region is $Ga_{0.4}Al_{0.6}As$, wherein said isolation region is n-conductivity type and has a doping level of $10^{14}$ atoms/cm$^3$ and a band gap, $E_g$, of 2.05 eV.

3. A bidirectional, integrated, optically coupled isolator comprising:

a light emitting diode of gallium aluminum arsenide semiconductor material said diode having a first layer of one conductivity type and a second layer of opposite conductivity type forming at their interface a light emitting p-n junction, wherein said first layer is $Ga_{0.7}Al_{0.3}As$, is of n-conductivity type and has a doping level in the range $10^{17}$ – $10^{18}$ atoms/cm$^3$, and a band gap, $E_g$, of 1.79 eV and wherein said second layer is $Ga_{0.9}Al_{0.1}As$, is of p-conductivity type and has a doping level in the range $10^{17}$ – $5\times10^{17}$ atoms/cm$^3$, and a band gap, $E_g$, of 1.55 eV, a photo detector of gallium aluminum arsenide semiconductor material, and an isolation region of gallium aluminum arsenide semiconductor material interposed between said diode and said photo detector, said isolation region being highly transparent to light emitted by said diode.

4. A bidirectional, integrated, optically coupled isolator comprising:

a light emitting diode of gallium aluminum arsenide semiconductor material, a photo detector of gallium aluminum arsenide semiconductor material said photo detector having a first layer of one conductivity type and a second layer of opposite conductivity type forming at their interface a light absorbing p-n junction wherein said first layer is $Ga_{0.7}Al_{0.3}As$, is of n-conductivity type and has a doping level in the range of $10^{17}$ – $10^{18}$ atoms/cm$^{-3}$, and a band gap, $E_g$, of 1.79 eV and wherein said second layer is $Ga_{0.9}Al_{0.1}As$, is of p-conductivity type and has a doping level in the range of $10^{17}$ – $5\times10^{17}$ atoms/cm$^3$, and, a band gap, $E_g$, of 1.55 eV, and an isolation region of gallium aluminum arsenide semiconductor material interposed between said diode and said photo detector, said isolation region being highly transparent to light emitted by said diode.

5. A bidirectional, integrated optically coupled isolator comprising:

a light emitting diode of gallium aluminum arsenide semiconductor material, a photo detector of gallium aluminum arsenide semiconductor material, an isolation region of gallium aluminum arsenide semiconductor material interposed between said diode and said photo detector, said isolation region being highly transparent to light emitted by said diode, and, a first contact region of gallium aluminum arsenide interposed between said light emitting diode and said isolation region and a second contact region of gallium aluminum arsenide interposed between said photo detector and said isolation region wherein said first and second contact regions are $Ga_{0.7}Al_{0.3}As$ of p-conductivity type and each having a doping level in the range of $10^{18}$ – $10^{-19}$ atoms/cm$^3$ and, an energy gap, $E_g$, of 1.79 eV.

6. A bidirectional, integrated, optically coupled isolator comprising:

a light emitting diode of gallium aluminum arsenide semiconductor material said diode having a first layer of one conductivity type and a second layer of opposite conductivity type forming at their interface a light emitting *p-n* junction, wherein said first layer is $Ga_{0.7}Al_{0.3}As$, is of *n* conductivity type and has a doping level in the range $10^{17}$ – $10^{18}$ atoms/cm$^3$, and a band gap, $E_g$, of 1.79 eV and wherein said second layer is $Ga_{0.9}Al_{0.1}As$, is of p-conductivity type and has a doping level in the range of $10^{17}$ – $5\times10^{17}$ atoms/cm$^3$, and a band gap, $E_g$, of 1.55 eV, a photo detector of gallium aluminum arsenide semiconductor material said photo detector having a first layer of one conductivity type and a second layer of opposite conductivity type forming at their interface a light absorbing p-n junction wherein said first layer is $Ga_{0.7}Al_{0.3}As$, is of n-conductivity type and has a doping level in the range of $10^{17}$ – $10^{18}$ atoms/cm$^{-3}$, a band gap, $E_g$, of 1.79 eV and wherein said second layer is $Ga_{0.9}Al_{0.1}As$, is of p-conductivity type and has a doping level in the range of $10^{17}$ – $5\times10^{17}$ atoms/cm$^3$, and, a band gap, $E_g$, of 1.55 eV, and an isolation region of gallium aluminum arsenide semiconductor material interposed between said diode and said photo detector said isolation region being highly transparent to light emitted by said diode and wherein said isolation region is $Ga_{0.4}Al_{0.6}As$.

7. A bidirectional, integrated, optically coupled isolator according to claim 6 wherein said isolation region is semi-insulating and has a doping level of $10^6$ atoms/cm$^3$ and a band gap, $E_g$, of 2.05 eV.

8. A bidirectional, integrated, optically coupled isolator according to claim 6 wherein said isolation region is n-conductivity type and has a doping level of $10^{14}$ atoms/cm$^3$ and a band gap, $E_g$, of 2.05 eV.

9. A bidirectional, integrated, optically coupled isolator according to claim 6, further including a first contact region of gallium aluminum arsenide interposed between said light emitting diode and said isolation region and a second contact region of gallium aluminum arsenide interposed between said photo detector and said isolation region wherein said first and second contact regions are $Ga_{0.7}Al_{0.3}As$ of p-conductivity type and each has a doping level in the range of $10^{18} - 10^{-19}$ atoms/$cm^3$ and, an energy gap, $E_g$, of 1.79 eV.

10. A bidirectional, integrated, optically coupled isolator according to claim 9 further including contact means connected to said first and second regions and to said first layers of said photodetector and said light emitting diode.

* * * * *